United States Patent [19]

Katagiri

[11] Patent Number: 4,647,148

[45] Date of Patent: Mar. 3, 1987

[54] FIBER OPTIC RECEIVER MODULE

[75] Inventor: Shuhei Katagiri, Tokyo, Japan

[73] Assignee: Tokyo Shibaura Denki Kabushiki Kaisha, Kawasaki, Japan

[21] Appl. No.: 594,018

[22] Filed: Mar. 27, 1984

[30] Foreign Application Priority Data

Mar. 31, 1983 [JP] Japan .................. 58-53508

[51] Int. Cl.⁴ .................................. G02B 6/42
[52] U.S. Cl. .................. 350/96.20; 250/227; 357/84
[58] Field of Search ........... 350/96.15, 96.17, 96.18, 350/96.20; 250/227; 357/30, 74, 80, 84

[56] References Cited

U.S. PATENT DOCUMENTS

| | | | |
|---|---|---|---|
| 3,908,185 | 9/1975 | Martin | 357/74 |
| 4,266,239 | 5/1981 | Miyagaki et al. | 357/84 |
| 4,360,823 | 11/1982 | van Gils | 357/84 X |
| 4,458,291 | 7/1984 | Yanagisawa et al. | 357/84 X |

Primary Examiner—John Lee

Attorney, Agent, or Firm—Cushman, Darby and Cushman

[57] ABSTRACT

A fiber optic receiver module comprises a substrate and circuit elements (i.e., IC and resistors, etc.) mounted on the substrate. The IC are electrically connected by bonding wires and bonding pads to input and output conductive patterns extending within the substrate. The leads of a photodetector are electrically connected to the input lines of the IC by pads formed on the substrate and the input conductive pattern. The output terminals of the module are connected to the output terminals of the IC by the output conductive pattern. Conductive layers are formed within the substrate. They are held at ground potential. The input and output conductive patterns are shielded from one another by these conductive layers. The circuit elements are shielded from the outside by a seal ring and a conductive shell both fixed to the upper surface of the substrate. The photodetector is located within a space defined by the seal ring, a metal cover covering the ring, a receptacle and a metal plate secured to the lower surface of the substrate. Hence, this element is shielded from the circuit elements and the output terminals of the module.

4 Claims, 5 Drawing Figures

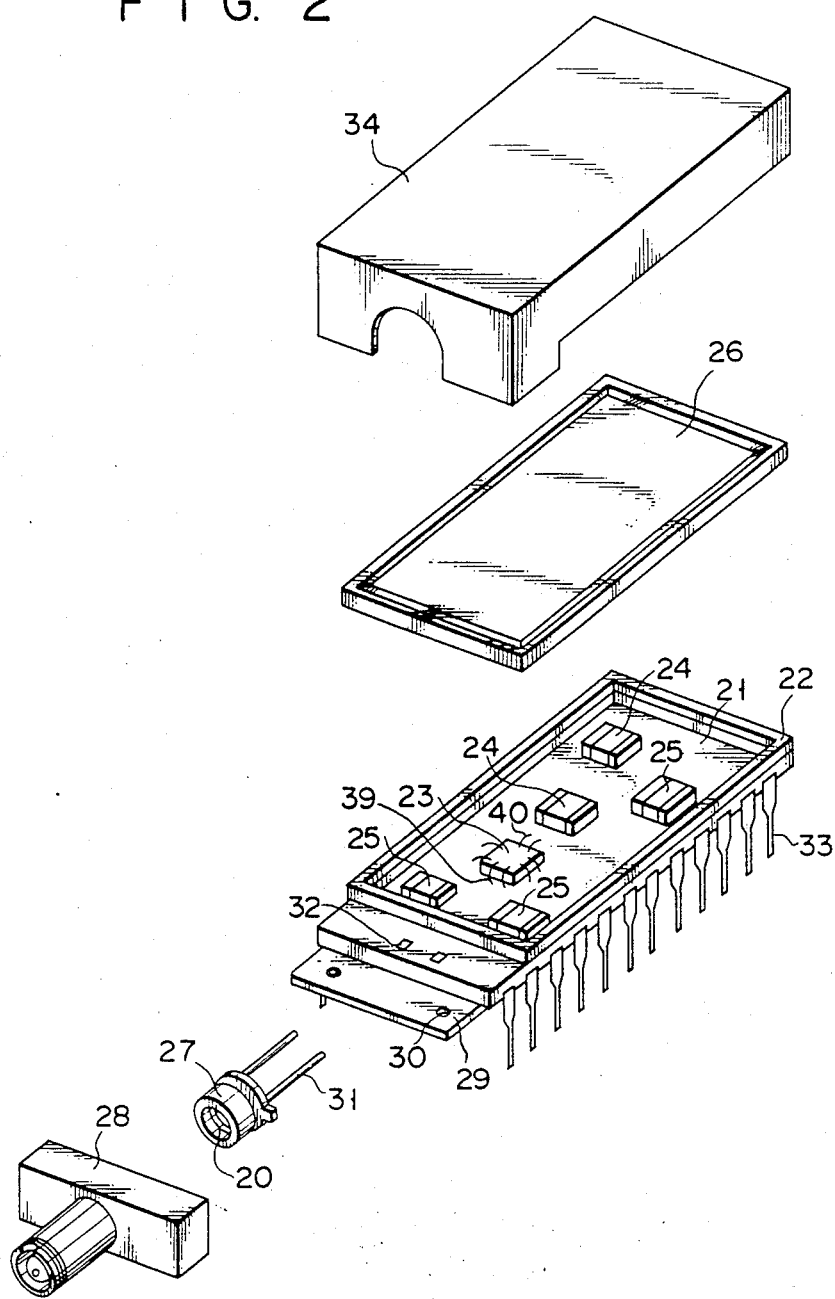
F I G. 2

FIBER OPTIC RECEIVER MODULE

BACKGROUND OF THE INVENTION

The present invention relates to a fiber optic receiver module which converts optical signals supplied through optical fibers into electric signals.

Generally, an optical communication system has a fiber optic receiver module which converts input optical signals into electric signals. FIG. 1 shows a known fiber optic receiver module. This module comprises output terminals 11, metal housing 12 and a circuit board 13 fixed within the housing 12. The circuit board 13 has a conductive pattern connected to the terminals 11. The terminals 11 extend outwardly from the housing 12. A light-receiving circuit and a photodetector 18 are mounted on the circuit board 13. The circuit comprises an IC (integrated circuit) 14, resistors 15-1 to 15-3, capacitors 16-1 and 16-2, and other electronic elements. The photodetector 18 is fitted in a receptacle 17 which may be connected to an optical connector (not shown). The input terminals 10-1 of IC 14, the output terminals 10-2 thereof, the terminals 10-3 of the resistors 15-1, 15-2 and capacitors 16-1, 16-2 and the terminals 20 of the photodetector 18 are connected to the conductive patterns. To shield all the electronic elements from the external electromagnetic field, the housing 12 is put into a metal case 19. The housing 12 and receptacle 17 are secured to the case 19 by screws or other fastening means.

When photo signals of about $10^{-7}$- $10^{-6}$ W are input to the module through the optical connector (not shown), they are converted by the photodetector 18 into electric signals of about $10^{-7}$- $10^{-6}$ A. The electric signals are supplied to the IC 14. The IC 14 amplifies these signals and then shapes their waveforms, thus generating voltage signals of a few volts. The voltage signals are output through the output terminals 11.

The fiber optic receiver module shown in FIG. 1 is disadvantageous. A stray capacitance is inevitably produced between the input lines of the light-receiving circuit and the output lines thereof. More specifically, a capacitance C exists between, on the one hand, the lead terminals 20, input terminals 10-1, and the conductive pattern connecting terminals 10-1 to terminals 20, and on the other hand, the terminals 10-2, output terminals 11 and the conductive pattern connecting terminals 10-2 to output terminals 11. Due to this capacitance C, the receiver module may erroneously operate or oscillate.

More specifically, as the voltage signals from the terminals 11 changes by $\Delta V$ for time $\Delta t$, current $i$ ($=C \cdot \Delta V/\Delta t$) is induced in the lead terminals 20 of the photodetector 18, in the input terminals 10-1 of IC 14, and in the conductive pattern of the board 13, which connects the terminals 10-1 to the terminals 20. The capacitance C is about 0.01 PF or less. Hence, this current is about $10^{-6}$ A if change $\Delta V$ is 3 V and time $\Delta t$ is about 30 ns. The current $i$ is nearly equal to the signal current (about $10^{-7}$- $10^{-6}$ A) supplied from the output terminals 20 of the photodetector 18. Here arises the risk that the module erroneously operates or oscillates. The current $i$ increases as the fiber optic receiver performs its function faster, thus shortening the time $\Delta t$. It follows that the fiber optic receiver module shown in FIG. 1 cannot convert the high frequency optical signal into a voltage signal.

Since the module is not sealed in an airtight fashion, the resistors 15-1, 15-2 and capacitors 16-1, 16-2 are exposed to moisture and may sooner or later fail to operate correctly. When the fiber optic receiver module was put to the pressure-cooker test at 121° and 2 atms, its ability remarkably deteriorated.

SUMMARY OF THE INVENTION

The object of the present invention is to provide a fiber optic receiver module which can reliably operate at high speed, without making errors or oscillating.

According to the invention, there is provided a fiber optic receiver module which comprises a substrate, receiver circuit elements mounted on the substrate, output terminals connected to the substrate, a photodetector, a first conductive pattern formed on the substrate and connecting the photodetector to the receiver circuit elements, a second conductive pattern formed on the substrate and connecting the receiver circuit elements to the output terminals, a conductive layer formed in the substrate, separating the first and second conductive patterns and held at ground potential, a first conductive member connected to the conductive layer and receiving the receiver circuit elements to shield the receiver circuit elements, and a second conductive member connected to the conductive layer and receiving the photodetector to shield the photodetector.

BRIEF DESCRIPTION OF THE DRAWINGS

FIG. 2 is an exploded perspective view of a fiber optic receiver module according to the present invention;

DETAILED DESCRIPTION OF THE PREFERRED EMBODIMENTS

Figure 1:
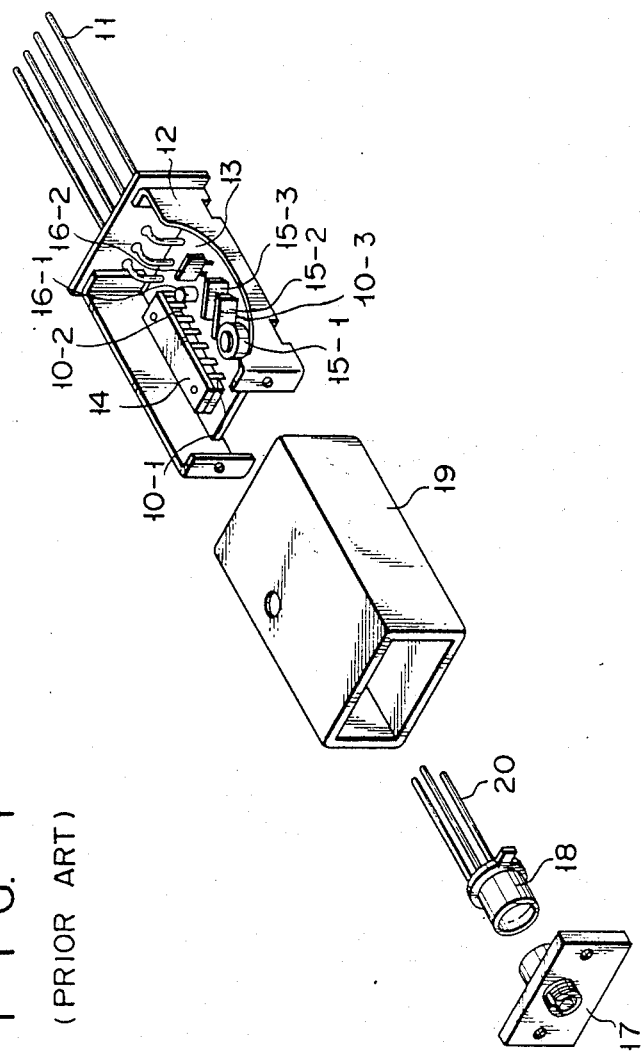
FIG. 1 is an exploded perspective view of a known fiber optic receiver module.
Figure 3:
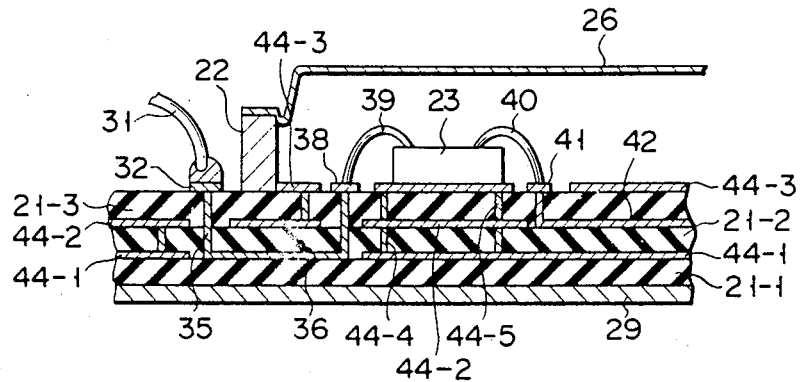
FIG. 3 is a sectional view of a part of the fiber optic receiver module shown in FIG. 2.

FIG. 2 shows a fiber optic receiver module according to the invention. The module comprises a substrate 21 made of, for example, ceramic. Conductive patterns 36 and 42 are formed on the substrate 21. A seal ring 22 made of Kovar a trademark of Westinghouse Electric Corp. (an Fe-Ni-Co alloy) is soldered to the upper surface of the substrate 21 by silver solder. An IC (integrated circuit) 23, resistor chips 24 and capacitor chips 25, which form a light-receiving circuit, are bonded to the substrate 21 by silver paste. IC 23 is electrically coupled to the conductive patterns 36 and 42 by bonding wires 39 and 40 (about 25 microns thick). A conductive shell 26 made of Kovar a trademark of Westinghouse Electric Corp. is seam-welded to the upper edge of the seal ring 22. A photodetector 20 is sealed within a metal package 27 in an airtight fashion. The package 27 is placed within a receptacle 28 which may be connected to an optical connector (not shown). The receptacle 28 is mounted on a metal plate 29 (or a heat-radiating plate) which is soldered to the lower surface of the substrate 21 by silver solder. It is secured to the plate 29 by screws (not shown) inserted in holes 30 of the plate 29. Lead wires 31 (about 0.45 mm thick) extend from the metal package 27. As shown in FIG. 3, they are soldered to conductive pads 32. A metal cover 34 covers the seal ring 22, the conductive shell 26, the package 27 and the receptacle 28. The photodetector 20 and lead wires 31 are sealed within the space defined by the cover 34, shell 26, seal ring 22 and metal plate 29. Hence, they are effectively shielded from the external magnetic field. They are also shielded from terminals 33 (with a cross section of about 0.25×0.43 mm) which are connected to the output section of the IC 23 by the conductive pattern 42 and extend outwardly from the substrate 21.

As shown in FIG. 3, the substrate 21 is of the type which has three insulation layers. More specifically, it is formed of a first insulation layer 21-1, a first conductive patterned layer 44-1, a second insulation layer 21-2, a second conductive patterned layer 44-2, a third insulation layer 21-3 and a third conductive patterned layer 44-3. These six layers are formed one upon each other. The conductive layer 44-3 is connected to the seal ring 22, and the conductive layers 44-1, 44-2 and 44-3 are connected to each other by conductive sections 44-4 and 44-5 which extend through the second and third insulation layers 21-2 and 21-3 in the lateral direction of the substrate 21. The layers 44-1, 44-2 and 44-3 do not cover the entire upper surfaces of the insulation layers 21-1, 21-2 and 21-3. On those areas of the third insulation layer 21-3 which are covered by no conductive layer, conductive pads 32, 38 and 41 are formed. The pads 32 and 38 are connected by a conductive pattern 36 which extends through the second insulation layer 21-2 and the third insulation layer 21-3 and along that area of the first insulation layer 21-1 which is not covered by the conductive patterned layer 44-1. The pad 41, which is connected to the output section of the IC 23, is connected to conductive patterns 42 which extend through the third insulation layer 21-3 and along that area of the second insulation layer 21-2 which is not covered by the conductive layer 44-2. The conductive pattern 42 is electrically coupled to the terminals 33.

An optical signal input to the photodetector 20 is converted into an electrical current signal of about $10^{-7}$–$10^{-8}$ A. The current signal is supplied to IC 23 via the lead wires 31, pad 32, conductive pattern 36, pad 38 and bonding wire 39. IC 23 converts this signal to a voltage signal, amplifies the voltage signal, and shapes the waveform thereof. The output signal of IC 23, which is about 3 V, is supplied to the terminals 33 through the bonding wire 40, pad 41 and conductive pattern 42.

The bonding wires 39 and 40 of the IC 23 are sealed within the casing consisting of the ceramic substrate 21, seal ring 22 and conductive shell 26. Moreover, this casing is covered by the metal cover 34 held at the ground potential. The conductive layers 44-1 to 44-3, ring 22, the shell 26 and the cover 34 are held at the ground potential. The stray capacitance between the wires 39, on the one hand, and the wires 40, on the other, is therefore not so large as to make the fiber optic receiver module erroneously operate or oscillate. The module can thus reliably operate at high speed. Although the bonding wires 39 and 40 are not fully shielded from the bonding pads 41 and 38, the stray capacitances between the wire 39 and the pad 38, and the wire 40 and the pad 41 are negligibly small. This is because the bonding wires 39 and 40 are made of gold and are relatively thick (25 microns), and the bonding pads 38 and 41 are about 200×200 microns. In addition, since the thickest lead wires 31, which may produce a large stray capacitance, are completely shielded from the terminals 33 by the metal cover 34, no large stray capacitance will be produced. In the actual fiber optic receiver module of the invention, the stray capacitance between the input lines and output lines of the light-receiving circuit was $10^{-15}$ F or less.

Since the light-receiving circuit is sealed in an airtight fashion by means of seam welding, the module is more reliable than the conventional fiber optic receiver module.

Figure 4:
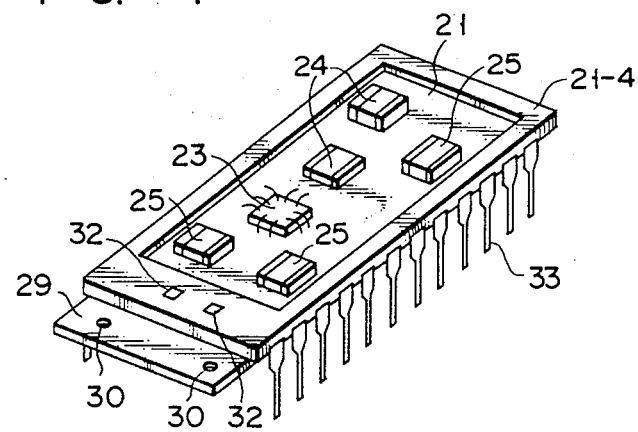
FIG. 4 is a perspective view of another photo receiver module.
Figure 5:
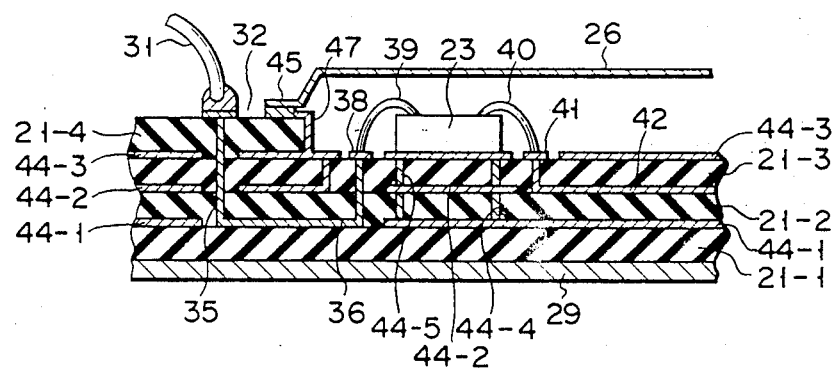
FIG. 5 is a sectional view of a part of the fiber optic receiver module shown in FIG. 4.

Now, another embodiment of the invention will be described with reference to FIGS. 4 and 5. The same numerals are used to designate like or the same elements as used in the embodiment of FIGS. 2 and 3. As shown in FIGS. 4 and 5, a conductive shell 26 is attached to a ceramic substrate 21 by an Au-Sn alloy solder 45, not by seam welding. A frame-shaped fourth insulation layer 21-4 is formed on the substrate 21. The outer periphery of this layer 21-4 is plated with silver, and the layer 21-4 is held at the ground potential.

As mentioned above, in the present invention, the stray capacitance between the input lines of the light-receiving circuit, on the one hand, and the output lines thereof, on the other, is extremely small. Furthermore, the light-receiving circuit is sealed in an airtight fashion. For these reasons, the fiber optic receiver module of the invention is very reliable and operates at high speed.

In the embodiment of FIGS. 4 and 5, the fourth insulation layer 21-4 may be omitted if the IC 23 is thin or if the conductive shell 26 is tall. In this case, no gold plating of the side wall 47 is necessary.

What is claimed is:

1. A fiber optic receiver module comprising: a substrate;
   receiver circuit elements including an IC chip mounted on said substrate;
   output terminals attached to said substrate;
   an output conductive pad formed on said substrate;
   first input conductive pads formed on said substrate;
   a second input conductive pad formed on said substrate;
   a photodetector having lead wires connected to said first input conductive pads;
   a first bonding wire connecting said output conductive pad and said IC chip;
   a second bonding wire connecting said second input conductive pad and said IC chip;
   a first conductive pattern formed in said substrate and connecting one of said first input conductive pads and said second input conductive pad;
   a second conductive pattern formed in said substrate and connecting said output conductive pad and one of said output terminals;
   a conductive layer formed in said substrate, held at ground potential, and covering said first and second conductive patterns respectively to separate said first and second conductive patterns;
   a first conductive shield housing connected to said conductive layer, for shielding said photodetector from said second bonding wire, said second input conductive pad, said IC chip and said second conductive pattern; and
   a second conductive shield housing connected to said conductive layer, for shielding said photodetector and the lead wires thereof from said output terminals.

2. A fiber optic receiver module according to claim 1 wherein said first shield housing covers said second bonding wire, said second input conductive pad, said IC chip and said second conductive pattern.

3. A fiber optic receiver module according to claim 2, wherein said second shield housing receives said first shield housing and said photodetector.

4. A fiber optic receiver module according to claim 1, wherein a conductive seal ring is formed on said substrate, and said first conductive shield housing is connected to the seal ring, thereby sealing said receiver circuit elements in airtight fashion.

* * * * *